United States Patent [19]

Gigl et al.

[11] Patent Number: 4,738,689

[45] Date of Patent: Apr. 19, 1988

[54] COATED OXIDATION-RESISTANT POROUS ABRASIVE COMPACT AND METHOD FOR MAKING SAME

[75] Inventors: Paul D. Gigl, Worthington, Ohio; Bonnie M. Hammersley, La Plata, Md.; David E. Slutz, Worthington, Ohio

[73] Assignee: General Electric Company, Schenectady, N.Y.

[21] Appl. No.: 920,041

[22] Filed: Oct. 16, 1986

Related U.S. Application Data

[63] Continuation-in-part of Ser. No. 591,627, Mar. 20, 1984.

[51] Int. Cl.$^4$ ............................................. B24D 3/02
[52] U.S. Cl. ........................................ 51/295; 51/293; 51/309
[58] Field of Search .......................... 51/293, 295, 309

[56] References Cited

U.S. PATENT DOCUMENTS

| | | | |
|---|---|---|---|
| 3,520,667 | 7/1970 | Taylor | 51/295 |
| 3,650,714 | 3/1972 | Farkas | 51/309 |
| 3,879,901 | 4/1975 | Caveney | 51/295 |
| 3,929,432 | 12/1975 | Caveney | 51/309 |
| 3,984,214 | 10/1976 | Pratt et al. | 51/295 |
| 4,112,631 | 9/1978 | Howard | 51/295 |
| 4,142,869 | 3/1979 | Vereschagin et al. | 51/295 |
| 4,399,167 | 8/1983 | Pipkin | 51/295 |
| 4,505,720 | 3/1985 | Gabor et al. | 51/295 |
| 4,606,738 | 8/1986 | Hayden | 51/295 |

*Primary Examiner*—Paul Lieberman
*Assistant Examiner*—Willie J. Thompson
*Attorney, Agent, or Firm*—Mueller and Smith

[57] ABSTRACT

Disclosed is an improved polycrystalline compact of self-bonded diamond particles having a network of interconnected empty pores dispersed throughout. The improved porous polycrystalline diamond compact possesses enhanced oxidation resistance and comprises all of the exterior surfaces of the porous compact being enveloped with a continuous coating which is effective under metal bond fabrication conditions so that oxidation of the diamond in the compact does not exceed a threshold level whereat loss of diamond properties of the compact occurs. Metal bond fabrication conditions comprehend an atmosphere containing oxygen or water vapor. Metal coatings are preferred, especially in coating thicknesses in excess of about 8 microns, and applied by a chemical vapor deposition process.

21 Claims, 5 Drawing Sheets

COATED OXIDATION-RESISTANT POROUS ABRASIVE COMPACT AND METHOD FOR MAKING SAME

CROSS-REFERENCE TO RELATED APPLICATIONS

This application is a continuation-in-part of application Ser. No. 06/591,627, filed Mar. 20, 1984.

BACKGROUND OF THE INVENTION

The present invention relates to polycrystalline masses of self-bonded diamond particles (i.e. polycrystalline compacts) useful as tool components and more particularly to a metal coated polycrystalline mass with enhanced oxidation resistance.

It is well known to use diamond, cubic boron nitride (CBN) or other abrasive particles embedded in the grinding, abrading, or cutting section of various tools. The active sections of such tools include resin bond and metal bond construction. Such abrasive particles have been coated with various metals and alloys of metals in single or multiple layers in order to enhance bond retention, improve high temperature oxidation resistance, suppress high temperature graphitization, and like benefits. Such coatings are especially useful when fine-grain diamond or other abrasive grits are employed in the various tools. Representative art in this single grain coating endeavor include British Pat. Nos. 1344237 and 712057, U.S. Pat. Nos. 2,367,404, 3,650,714, 3,957,461, 3,929,432, 3,984,214, and German Offenlegungsschrift No. 2124637.

Also well known in this art are compacts of polycrystalline abrasive particles typified by polycrystalline diamond and polycrystalline CBN compacts. Such compacts are represented by U.S. Pat. Nos. 3,745,623 and 3,609,818 with respect to polycrystalline diamond compacts and U.S. Pat. Nos. 3,767,371 and 3,743,489 with respect to polycrystalline CBN compacts. While such polycrystalline compacts represent a significant contribution to the art in many fields of use, thermal degradation at elevated temperature, e.g. above about 700° C., did limit their usefulness, especially in metal matrix bond applications. The thermal stability of such polycrystalline compacts was improved with the advent of porous self-bonded diamond and CBN compacts containing less than about 3% non-diamond phase, hereinafter termed "porous compact". Compacts of this type are the subject of U.S. Pat. Nos. 4,224,380 and 4,288,248.

Since, on a microscale, the surface of porous compacts is extremely rough, bond retention by mechanical means generally is adequate; hence, the art has not recognized a general need for a matrix bond reactive coating as is the case with a microcrystalline counterpart. Additionally, the excellent thermal stability property possessed by the noted self-bonded diamond particles with an interconnected network of pores dispersed throughout is postulated to be due to the removal of metallic sintering aid normally found in such compacts which metallic substance possesses a different coefficient of thermal expansion than is possessed by the diamond. Thus, it was theorized that application of a matrix bond reactive coating could subject the porous compact to possible reinfiltration by the coating metal with consequent loss of thermal stability occasioned thereby.

An additional factor militating against application of a matrix bond reactive coating is the expected stability of such compact to not oxidize at higher temperatures of processing required in metal bond formation. Oxidation stability is not a recognized problem of conventional compacts. Moreover, larger single-crystal diamond of comparable dimension is known to possess fairly good oxidation stability due to their large size since diamond oxidation is a function of temperature, time, and state of subdivision (surface area per unit weight).

BROAD STATEMENT OF THE INVENTION

The present invention is based on the recognition that the above-described porous polycrystalline compacts exhibit unexpectedly inferior oxidation resistance compared to conventional polycrystalline diamond compacts or single-crystal diamond of similar size (i.e. weight). Since metal bond formation should be conducted under an inert or reducing atmosphere and since the porous compacts are known to possess thermal stability, manufacturers (which process the compacts into a metal bond tool) ordinarily would not observe significant oxidation degradation as such inert or reducing conditions would not contribute to any oxidation. Also, manufacturers would not expect to see significant oxidation degradation.

Yet, metal bond fabrication is not always conducted under inert atmosphere conditions so that oxidation could be worse than thought, as noted above. Fortuitously, with the recognition that the porous compacts exhibit an oxidation profile like that of mesh diamond, the present invention was arrived at for enhancing the oxidation resistance of such porous compacts. The present invention, then, is an improved polycrystalline compact of self-bonded diamond particles having a network of interconnected empty pores dispersed throughout. The improvement in the polycrystalline mass or compact is for enhancing oxidation resistance of this type of compact and comprises all of the exterior surfaces of said compact being enveloped with a continuous coating which is effective under metal bond formation conditions so that oxidation of the diamond in said compact does not exceed a threshold level whereat loss of diamond properties of the compact occurs. Metal bond fabrication conditions are defined herein as comprising a temperature of not substantially above about 1200° C. in the presence of oxygen or water vapor, i.e. oxidizing substances under metal bond fabrication conditions.

The corresponding method for improving the oxidation resistance of the porous polycrystalline compact comprises enveloping all of the exterior surfaces of the mass with a continuous coating which is effective under metal bond formation conditions so that oxidation of diamond in said compact does not exceed a threshold level whereat loss of diamond properties of the compact occurs. Depending on the coating method and coating material, the coating generally will range in thickness from about 8 microns to about 150 microns in thickness.

Advantages of the present invention include the enhancement of oxidation resistance of the porous mass or compact while preserving the excellent thermal stability thereof. Another advantage is that the oxidation resistance enhancement is achieved without undersirable loss of properties of the compact, e.g. as a tool component. A further advantage is an improved porous polycrystalline compact which is well retained within a metal matrix. These and other advantages will become readily apparent to those skilled in the art based upon the disclosure contained herein.

DETAILED DESCRIPTION OF THE INVENTION

As noted above, diamond oxidation is a function of temperature, time, and state of subdivision. As a pure chemical species, diamond has a specific oxidation threshold temperature. Unexpectedly, it was a discovery of the present invention that the state of subdivision of the diamond was an important consideration in assessing diamond oxidation. That is, while it would be expected that a polycrystalline mass would behave in a manner like that of an equivalent weight single crystal diamond, with respect to diamond oxidation, it was discovered that the porous polycrystalline mass exhibited oxidation characteristics more typical of very small single crystals. This is theorized to occur, in part, due to the rough surface and connected porosity of the porous mass. The following table displays comparative oxidation rate data for various diamond types in normal air and enhances an understanding of the specific oxidation threshold temperature for such various diamond types.

TABLE 1[a]

| Sample | Temperature (°C.) for[b] 1% Weight Loss at 2° C./Minute Heating Rate | Interpolated Temperature (°C.) Oxidation Threshold at 100° C./Minute Heating Rate |
| --- | --- | --- |
| 1/5 Carat Natural Single Crystal | 852 | 960 |
| 20/25 Mesh Synthetic Diamond | 770 | 900 |
| 230/270 Mesh Synthetic Diamond | 640 | — |
| 230/270 Mesh Natural Diamond (Crushed Bort) | 640 | 725 |
| Porous Polycrystalline Diamond Compact | 627[c] | 765 |
| 230/270 Mesh Crushed Synthetic Diamond | 615 | 740 |

[a]TGA analysis, see Examples for details.
[b]Heating schedule of 50° C./min. to 500° C., then 2° C./min.
[c]Average of 6 samples ranging from 7.93 to 130.54 mg in weight, temperature range of 612° C.-662° C.

The above-tabulated information emphasizes the importance which dimension of the diamond has on its oxidation threshold temperature. Also apparent from the foregoing table is the influence which heating rate has on the oxidation threshold temperature. Quite unexpected is the low oxidation threshold temperature determined for the porous polycrystalline diamond compacts. It is the improvement in oxidation resistance or stability with concomitant preservation of performance and thermal stability of the porous polycrystalline diamond compact which is achieved in accordance with the precepts of the present invention.

Referring initially to the porous polycrystalline diamond compacts, reference again is made to U.S. Pat. Nos. 4,224,380 and 4,288,248 which provide a full disclosure thereof. The porous polycrystalline diamond compact comprises diamond particles which comprise between about 70% and 95% by volume of the compact. A metallic phase of sintering aid material is present substantially uniformly throughout the compact and is in a minor amount, typically ranging from about 0.05 to about 3% by volume of the compact. A network of interconnected empty pores are dispersed through the compact and are defined by the diamond particles and the metallic phase. Such pores generally comprise between about 5% and 30% by volume of the compact. The compact is comprised of self-bonded diamond particles typically ranging in size from between about 1 and 1,000 microns. While such compacts may be bonded to a substrate, e.g. cobalt cemented tungsten carbide, such supported porous compacts typically do not encounter processing conditions under which oxidation stability problems are encountered, though certainly the teachings of the present invention may be applied to such composite compacts. Also, while not yet tested, the advantages of the present invention may be applicable to coating porous CBN compacts.

The metallic phase of sintering aid material is a catalyst/solvent for diamond and is utilized in compact formation by a high pressure/high temperature technique well known in the art and typified by U.S. Pat. Nos. 2,947,609 and 2,947,610. Such catalytic material is selected from the group consisting of a catalytic metal, in elemental form selected from the group consisting of Group VIII metals, chromium, manganese, tantalum; a mixture of alloyable metals of the catalytic metals and noncatalytic metals; an alloy of at least two of the catalytic metals; and an alloy of catalytic metal and non-catalytic metal. Cobalt in elemental or alloy form has found favor in the art as the metallic phase or catalyst/solvent for diamond compact formation.

The porous polycrystalline diamond compact is converted to its thermally stable form by removal of the metallic phase by acid treatment, liquid zinc extraction, electrolytic depleting, or similar processes. The compact has substantially no residual metallic phase to catalyze back-conversion, or expand at a rate different than the surrounding diamond, or to catalyze the conversion of diamond to graphite, and thereby break the diamond-diamond particle bonds at elevated temperature. It is this desire to prevent this thermal degradation which the art has recognized in its predilection to not coat the porous polycrystalline diamond mass. In this regard, the art also recognizes the importance in embedding the porous polycrystalline diamond compact in a metal matrix under conditions such that metal bond formation does not result in reinfiltration of metal into the compact to any significant degree. Such care in processing ensures the desired thermal stability characteristic of the porous polycrystalline diamond compact. Under proper processing conditions, the porous polycrystalline diamond compact is stable up to 1200° C. to 1300° C. without substantial thermal degradation. Such conditions, as the art well recognizes, include an inert or reducing atmosphere when temperatures are expected to be above 600°-700° C.

According to the present invention, the porous polycrystalline diamond compact thus-formed then is subjected to a coating process for enveloping all of the exterior surfaces of the compact with a continuous coating. The coating most probably will be a metal for economy and efficiency, and typically will be a metal familiar through use in the diamond art field. Such coating metal may be an inert barrier under metal bond formation conditions or may be a sacrificial or passivated coating, e.g. reactive with oxygen or water vapor like titanium. Metal coatings will be preferred for imparting compatibility with the metal matrix, remaining stable in the processing atmosphere, being stable in the presence of diamond, and being durable during processing. The coating may soften or even melt during metal bond fabrication without departing from the spirit of the invention, so long as the threshold level whereat loss of diamond properties is evidenced does not occur during processing. Of importance is that a minimum thickness and continuity of the coating be maintained. Corresponding with thickness is the porosity exhibited by the particular material applied as the coating. Certainly, denser coating materials will provide a more effective barrier to oxygen and permit a thinner coating to be applied, whereas more porous coating materials may require increased thickness to compensate therefor. Such porosity or density may be inherent in the material and may be a result of the particular method of choice for application of the coating. Depending on the coating method and material, the coating generally will range in thickness from about 8 microns to about 150 microns or even higher on occasion.

Metals predominating in the diamond art field include, for example, nickel, copper, titanium, iron, cobalt, chromium, tantalum, tungsten, niobium, zirconium, vanadium, molybdenum, and the like. The metal also may be provided in compound form, e.g. titanium carbide or titanium nitride. Of course mixtures, successive layers (of the same or different composition, e.g. an inner layer of refractory metal like W or Zr and an outer layer of other conventional metal), or alloys may be employed as necessary, desirable, or convenient. While metal coatings probably will find favor in the art, it should be understood that acceptable coatings may include ceramic coatings, organometallic coatings, or the like provided that the characteristics necessary for accomplishing the oxidation resistance enhancement are displayed by such material. In this regard, the coating material need not be a carbide-former, i.e. need not react with diamond for forming a chemical bond therewith. It should be understood, however, that should some chemical reaction between the coating material and the diamond occur, such reaction may be tolerated and even desired provided that substantially little or no loss of diamond properties of the compact occurs thereby. By threshold level whereat loss of diamond properties of the compact occurs is meant that the diamond properties exhibited by the porous polycrystalline diamond compact are maintained. Such properties include, for example, thermal stability, transverse rupture strength, hardness, and like properties, for example as noted in U.S. Pat Nos. 4,224,380 and 4,288,248. It should be understood that sacrifice of some of the compact can be tolerated without loss of such diamond properties as those skilled in the art will appreciate.

Metal coatings may be applied to the porous polycrystalline diamond compact by a variety of techniques including, for example, electrolytic plating, metal evaporation, sputtering including reactive sputtering techniques, chemical vapor deposition, pack diffusion, plasma coating, or the like. Certain advantages and limitations are inherent in each of these techniques, e.g. coating thickness and uniformity of thickness, conditions of operation, etc. For economy and efficiency, the coating thickness should be sufficient to achieve the desired degree of oxidation stability with excess coating thicknesses generally not recommended for economy and efficiency of the resulting product. The presently preferred process involves chemical vapor deposition (CVD) of the coating material as this process appears to provide rather uniform thickness and very good integrity of the resulting coatings. CVD gives lower porosity per unit thickness. An electrolytically deposited metal overcoat of the CVD coated porous compacts can be quite advantageous too. Various techniques, including the preferred chemical vapor deposition technique, will be illustrated in the Examples.

Metal bond fabrication typically is practiced at temperatures ranging from as low as about 700° C. on up to temperatures of about 1200° C. or slightly higher. Since the porous polycrystalline diamond compact is susceptible to oxidation within such temperature range, protection is required. In this regard, it should be restated that the porous compact is quite thermally stable when processed under an inert or reducing atmosphere. As oxidizing conditions are created, typically by the presence of air or water vapor, oxidation, however, will commence. At lower levels of oxygen or water in the atmosphere, it appears that thinner coatings can be tolerated for achieving the requisite degree of protection. However, it should be recognized that only trace amounts of water or oxygen are required for commencement of the oxidation process. It should be emphasized additionally that the presence of even pinholes in the coating normally cannot be tolerated as oxygen will penetrate into the porous compact and degradation quickly ensue. Employment of the coated compact of the present invention has the benefit of permitting processing thereof to be conducted under less stringent or rigorous conditions. Additionally, a measure of protection is afforded in case accidental entry of oxygen or water vapor into the process is experienced. Metal bond formation can be practiced conventionally by molding of metal powder as well as by conventional infiltration or like techniques. Such practices are quite conventional and little more need be stated about such metal bond formation herein.

The following examples show how the present invention can be practiced but should not be construed as limiting. In this application, all proportions and percentages are by weight and all units are in the metric system, unless otherwise expressly indicated. Also, all citations are expressly incorporated herein by reference.

IN THE EXAMPLES

Thermogravimetric analysis (hereinafter TGA) is a continuous measure of sample weight under elevated temperature conditions in a controlled atmosphere. A decrease in sample weight is indicative of volatile reaction products being evolved from the sample. For diamond, oxygen will react at elevated temperature to form carbon monoxide, carbon dioxide, and mixtures thereof. J.E. Field (Editor), *The Properties of Diamond*, Academic Press, New York, New York (1979). TGA measurement will permit determination of the threshold temperature at which diamond products commence oxidizing. TGA curves reported herein were generated on a DuPont 1090 Thermal Analyzer with all samples being placed on a platinum sample holder. All atmospheres were introduced at a rate of 75 ml/min. An "air" atmosphere utilized bottled breathing air. Argon carrier gas was of commercial purity (99.9% pure).

Porous polycrystalline diamond compacts were prepared in accordance with U.S. Pat Nos. 4,224,380 and 4,288,248. The compacts evaluated ranged in size from just under 8 mg to in excess of 130 mg total weight. Titanium metal coating was applied to the porous polycrystalline diamond compacts by conventional sputtering deposition techniques. Nickel-phosphorous coatings were applied by conventional electroless deposition techniques in successive layers in order to achieve the desired thickness level reported in the examples. Additional experimental details will be set forth in connection with each of the examples which follows.

EXAMPLE 1

Figure 1:
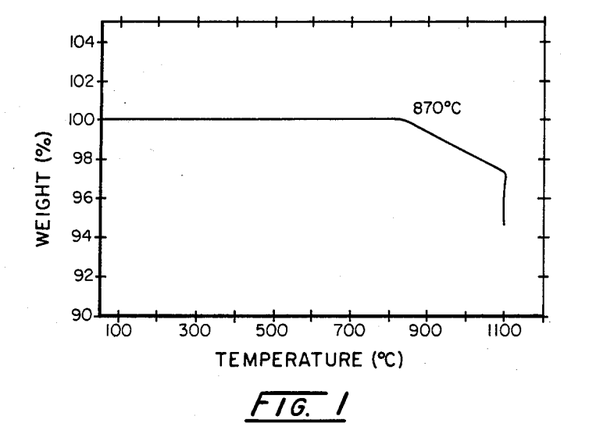
FIGS. 1-10 are thermogravimetric analysis curves of 5 porous compacts prepared and tested in the Examples. Details of such test are displayed in the Examples.

Porous polycrystalline diamond compact (62 mg total weight) was subjected to TGA analysis over a temperature range of 2520 C.–1150° C. at a heating rate of 5° C./min. FIG. 1 displays the TGA curve recorded under a heating atmosphere of commercial argon gas (5 ppm oxygen and 5 ppm moisture). A 1% weight loss of the sample was recorded at 870° C. The extremely corrosive nature and high rate of reactivity of low levels of oxygen/water vapor with the porous polycrystalline diamond compacts is demonstrated in this run.

Figure 2:
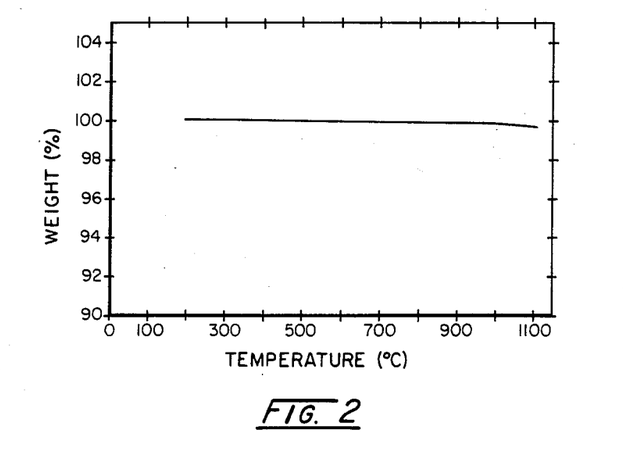

The TGA test was repeated except that a drying system (calcium sulfate column) was attached to the inlet argon gas line. Additionally, a copper strip was placed inside the TGA furnace to absorb any oxygen/moisture trapped and condensed in the gas. The results of this run are displayed in FIG. 2. It will be noted that virtually no sign of weight loss (0.25 weight percent recorded) under the same experimental conditions was recorded. This demonstrates that manufacturers which maintain the recommended inert or reducing atmospheric conditions in metal bond formation with the subject porous polycrystalline diamond compacts would experience little loss of compact, and thus little loss, at most, of resulting diamond physical properties under appropriate processing conditions. Manufacturers which do not maintain appropriate conditions, or manufacturers which experience equipment malfunction, will lose diamond readily from the compact with attendant loss of diamond properties.

Referring once again to FIG. 1 above, it is surprising and unexpected that the porous polycrystalline diamond compacts oxidize like fine particle diamond rather than like single crystalline diamond of comparable weight. Nevertheless, such reactivity with oxygen is demonstrated by the results in this example.

EXAMPLE 2

In order to enhance oxidation stability of the porous polycrystalline diamond compacts, various compacts were coated with titanium (3–5 microns coating thickness) and nickel-phosphorous (about 30 microns coating thickness). The titaniumcoated compact (23.41 mg compact weight prior to coating) was heated at a rate of 92° C./min. to an isothermal condition of 1100° C. in an air atmosphere. At a temperature of 780° C., substantial loss of diamond was recorded. On a substantially identical compact coated with titanium by conventional sputter technique, when tested in an argon atmosphere with traces of oxygen in water, the sample showed an increase in weight to a temperature of about 1000° C. followed by a small weight decrease (0.5 weight percent) during the next half hour of testing. The weight increase apparently is due to oxide formation on the titanium coating with residual oxygen in the commercial argon atmosphere. Thereafter, the weight decrease is believed to be due to oxidation of the diamond. It is believed that the coating lacked sufficient thickness to provide effective protection under processing conditions.

Additional samples of porous compact were coated with a nickel-phosphorous coating to a thickness of about 30 microns and TGS tests conducted under isothermal heating conditions at a temperature of 850° C. after a temperature ramp of 94° C./min. Under such conditions, the compacts remained stable to oxidation for a total heating time of 18 minutes. Additional compact samples from the same lot when tested under isothermal conditions to 1000° C., however, quickly oxidized after only 10 minutes of heating. These results suggest that the more rapid heating rate schedule employed results in an increased oxidation threshold temperature compared to samples which are heated at a slower rate. It is possible that the 850° C. isothermal tested coated compact may be subject to oxidation upon longer times of heating based upon these and other test conducted during the course of research on the present invention.

An additional sample was coated with a 7.7 wt % copper coating estimated to be 50 microns in thickness. This sample was subjected to an 850° C. isothermal TGA analysis after a similar 94° C./min. heating ramp. After about 4–5 minutes of heating, some increase in weight was noted. At about 9 minutes heating time when the temperature had reached 800°, substantial weight loss commenced. It appears that the initial weight gain can be attributed to oxidation of the copper and subsequent weight loss attributed to oxidation of the diamond. It was suspected that the copper coating was porous also.

EXAMPLE 3

Figure 3:
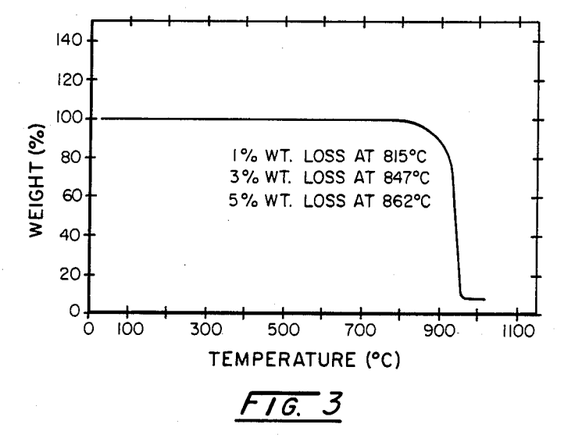
Figure 4:
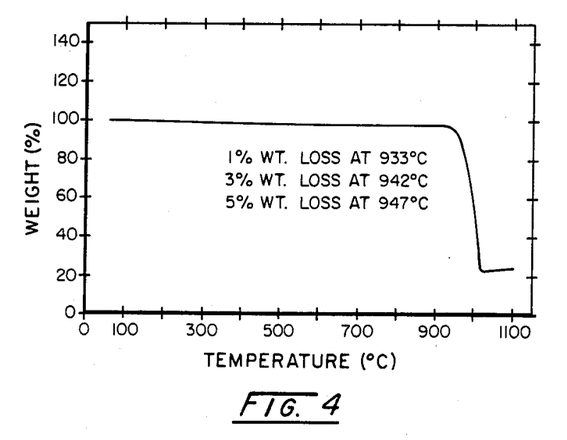
Figure 5:
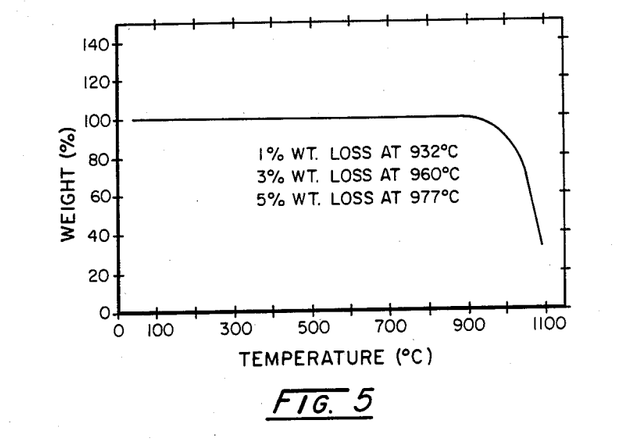

Additional samples of porous compact were coated with nickel phosphorous coating at thicknesses ranging from 30 microns to in excess of 100 microns. Each of the coated samples was subjected to TGA evaluation in an air atmosphere following a heating regimen of 50° C. per minute to a temperature of 500° C. followed by a 2° C. per minute heating schedule. By using the weight at 500° C., any weight loss due to desorption of material is disregarded in the analysis. Also, no oxidation or other undesirable loss of properties results at such threshold temperature. Sample 1 weighted 71.42 mg, sample 2 weighted 82.52 mg, and sample 3 weighed 162.61 mg. The TGA weight loss results at 1%, 3%, and 5% by weight loss are displayed in the following table and in corresponding FIGS. 3–5.

TABLE 2

| Sample No. | Coating Thickness (microns) | Temp (°C.) 1% Weight Loss | Temp (°C.) 3% Weight Loss | Temp (°C.) 5% Weight Loss |
| --- | --- | --- | --- | --- |
| 1 | 30 | 815 | 847 | 862 |
| 2 | 40–50 | 933 | 942 | 947 |
| 3 | 100–150 | 932 | 960 | 977 |

The above-tabulated results show that the slower heating schedule results in a lower threshold temperature whereat oxidation of the diamond commences. These results also demonstrate that the 30 microns coating, while an improvement over uncoated porous polycrystalline diamond compact, is at an apparent approximate minimum thickness for providing adequate oxidation stability when compared, for example, to natural diamond which generally is stable up to 850° C. or slightly higher.

At a coating thickness of 40–50 microns, however, the threshold temperature has increased by about 100°

C. compared to the 30 microns coating. A compact which is substantially more resistant to oxidation than natural single crystal diamond clearly has been manufactured. At a thickness of about 100–150 microns, however, no apparent benefit in oxidation stability has been achieved at the expense of extra coating thickness. It should be recognized that these coating thicknesses, of course, are appropriate for nickel-phosphorous coatings. It would be expected that somewhat different coating thicknesses would be appropriate for different coating materials.

EXAMPLE 4

Additional porous polycrystalline diamond compacts were coated with a layer of TiN. The TiN coating was formed by chemical vapor deposition utilizing titanium tetrachloride, hydrogen, and nitrogen which were deposited onto the compacts at a temperature of 800° C. It was determined that coating thicknesses ranging from about 8–15 microns could be obtained within 8 hours. Longer reaction times result in thicker coatings.

Titanium nitride coated compacts at 8 microns coating thickness (Sample 3) and 11 microns coating thickness (Sample 4) were subjected to TGA tests employing a 2° C. per minute heating rate in air. Additional samples tested included an uncoated porous polycrystalline diamond compact (Sample 1), a 1/5 carat natural diamond (Sample 2), and a porous polycrystalline diamond compact that had been coated with titanium/nickel at a total thickness of 100 microns (titanium applied by pack diffusion followed by nickel applied by electroplating) (Sample 5).

Figure 6:
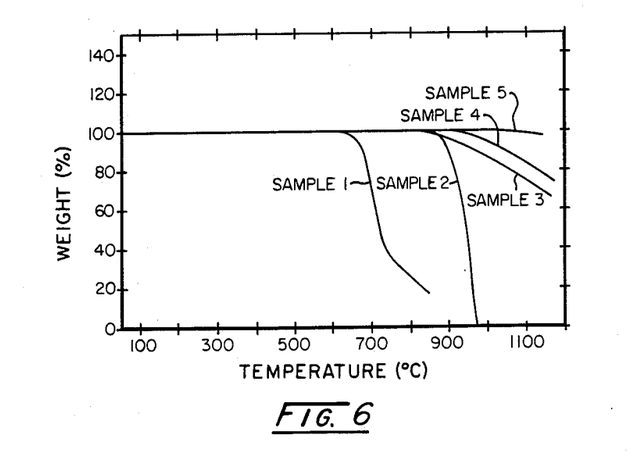

The results of the TGA tests are set forth in FIG. 6. It will be observed that the uncoated porous polycrystalline diamond compact (Sample 1) exhibited poor oxidation stability at moderately elevated temperatures. As described above, an acceptable oxidation-resistant porous polycrystalline diamond compact is achieved when its oxidation stability is at least that of an equivalent weight single crystal diamond. It will be observed that the 8 microns TiN coated product (Sample No. 5) exceeded the target oxidation resistance of the uncoated natural diamond. An improvement in oxidation stability also was realized with the 11 microns TiN coated product (Sample No. 4). While the thinly-coated TiN samples exceed the target oxidation resistance, it will be observed that the very thickly coated titanium/nickel product (Sample No. 5) displayed outstanding oxidation stability, though such stability was achieved at the expense of a relatively thick coating.

EXAMPLE 5

Though excellent oxidation resistance was achieved by coating the porous polycrystalline diamond compacts with thin TiN coatings in Example 4, such coated compacts do not provide acceptable bonding to certain matrix compositions including copper. Certain drilling and mining drill bit applications call for the use of copper/tungsten matrix alloys. Thus, this example looks to the retention of excellent oxidation stability by coating the porous polycrystalline diamond compact, yet provide bondability to copper-based matrix compositions. Accordingly, porous polycrystalline diamond compacts were coated with TiC coatings by the preferred chemical vapor deposition process. The process conditions included reacting titanium tetrachloride, hydrogen, and methane over the polycrystalline diamond compacts at a temperature of 1,000° C. Samples of the TiC coated compacts were found to be successfully brazed using pure copper as the braze. This brazing was carried out under vacuum at a temperature of 1,100° C. and resulted in shear strengths of 1540 psi.

Figure 7:
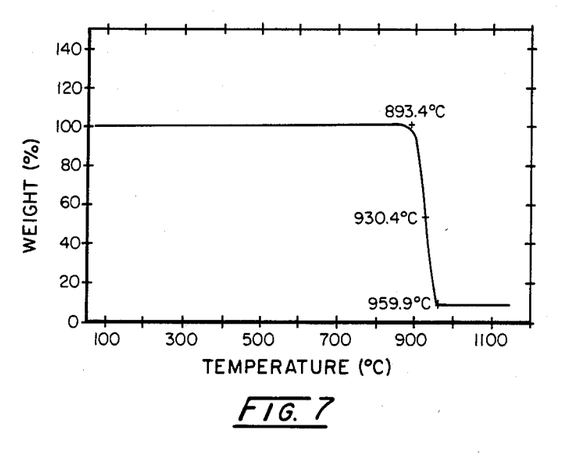
Figure 8:
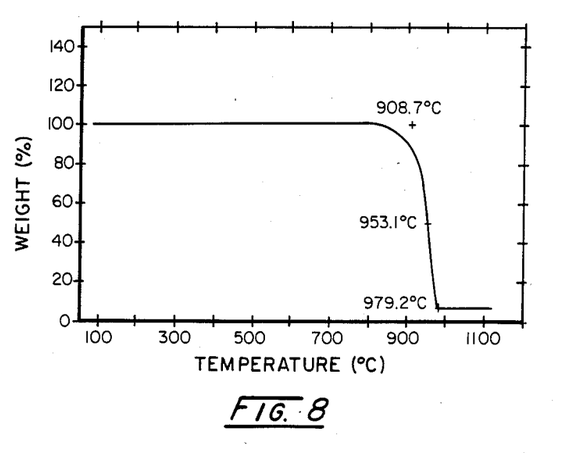

In order to ensure that the product maintained its oxidation resistance, additional samples of the TiC coated compacts were subjected to TGA tests as described in Example 4. FIG. 7 sets forth the results of the TGA tests conducted on a 10 microns thick TiC coating on the porous polycrystalline diamond compact. Note that the oxidation stability was maintained to a temperature of about 893° C. at which temperature the diamond commenced to oxidize as indicated by the loss in weight. As FIG. 8 demonstrates, increasing the coating thickness of TiC to 18 microns increased the temperature at which oxidation commences to about 908° C. Thus, an increase in thickness of 8 microns has resulted in an oxidation stability increase of only 15° C.

Additional samples of the 18 microns thick TiC coated compacts then were overcoated with a thin (17 microns) coating of nickel applied by electroplating. As FIG. 9 reveals, the dual coated samples evidenced no oxidation problems up to about 1,095° C. Thus, the thin nickel overcoat has resulted in an unexpectedly large increase in oxidation resistance of the 18 micron titanium carbide coated compact samples.

Figure 9:
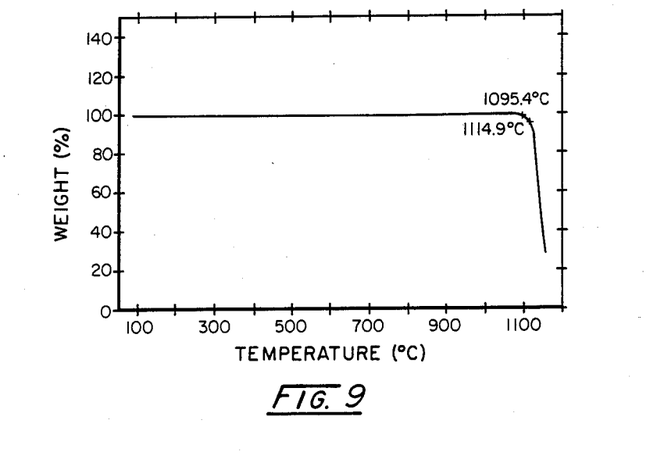
Figure 10:
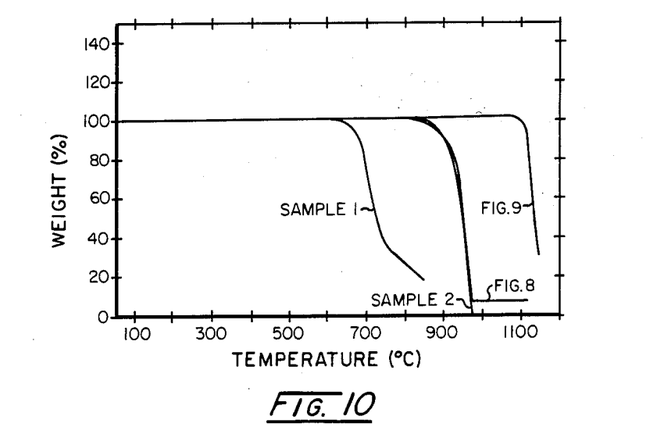

To place the foregoing data in perspective, reference is made to FIG. 10 which displays the TGA test results for the conventional uncoated porous compact (Sample 1 of Example 4), the one-fifth carat natural diamond (Sample 2 of Example 4), the 18 microns thick TiC coated compact (FIG. 8), and the 18 microns TiC/17 microns nickel dual coated compact (FIG. 9). The results in FIG. 10 show the relationship between these products. Again, it will be observed that the 18 microns TiC coated compact achieves the minimum target oxidation resistance of a substantially equivalent weight single crystal diamond. The excellent stability of the TiC/nickel dual coated compact clearly is seen in the context of the uncoated compact sample and the equivalent weight single crystal diamond sample.

We claim:

1. In a tool component polycrystalline compact of self-bonded diamond particles having a network of interconnected empty pores dispersed throughout the compact, the improvement for enhancing oxidation resistance of said porous compact which comprises all of the exterior surfaces of said compact being enveloped with a continuous coating which is effective under tool metal bond fabrication conditions in the presence of oxygen or water vapor so that oxidation of diamond in said compact does not exceed that of a single crystal diamond of comparable weight processed under said fabrication conditions.

2. The compact of claim 1 wherein said coating is at least about 8 microns in thickness.

3. The compact of claim 1 wherein said coating is metal.

4. The compact of claim 3 wherein said coating is at least about 8 microns in thickness.

5. The compact of claim 4 wherein the coating ranges in thickness from about 8 to 150 microns.

6. The compact of claim 3 wherein said metal coating is selected from the group consisting of nickel, copper, titanium, iron, cobalt, chromium, tantalum, mixtures thereof.

7. The compact of claim 6 wherein said metal coating is titanium nitride or titanium carbide.

8. The compact of claim 1 wherein said continuous coating comprises successive layers of the same or different coating.

9. A method the improvement comprising enveloping all of the exterior surfaces of said porous polycrystalline compact with a continuous coating which is effective under tool metal bond fabrication conditions in the presence of oxygen or water vapor so that oxidation of diamond in said compact does not exceed that of a single crystal diamond of comparable weight processed under said fabrication conditions.

10. The method of claim 9 wherein said compact is enveloped with a continuous coating which is at least about 8 microns in thickness.

11. The method of claim 9 wherein said coating is metal.

12. The method of claim 11 wherein said coating is at least about 8 microns in thickness.

13. The method of claim 12 wherein said coating ranges in thickness from about 8 to 150 microns.

14. The method of claim 11 wherein said compact is enveloped with a coating comprising nickel, copper, titanium, iron, cobalt, chromium, tantalum, and alloys thereof.

15. The method of claim 14 wherein said compact is enveloped with a coating comprising titanium carbide or titanium nitride, and then is overcoated with a nickel coating.

16. The method of claim 11 wherein said enveloping comprises chemical vapor deposition.

17. The method of claim 16 wherein said chemical vapor deposition enveloped compact then is electrolytically coated with a metal.

18. In a method the improvement in enhancing oxidation resistance of said porous compact under metal bond fabrication conditions in the presence of oxygen and water vapor, which comprises enveloping all of the exterior surfaces of said porous compact with a continuous coating which is effective under said tool metal bond fabrication conditions so that oxidation of diamond in said compact does not exceed a threshold level whereat loss of diamond properties of said compact occurs.

19. The method of claim 18 wherein said coating on said polycrystalline compact is metal.

20. The method of claim 18 wherein said coating is at least about 8 microns in thickness.

21. The method of claim 19 wherein said metal comprises nickel, copper, titanium, iron, cobalt, chromium, tantalum, tungsten, niobium, zirconium, vanadium, molybdenum, and alloys, compounds, and mixtures thereof.

* * * * *